(12) United States Patent
Suzuki et al.

(10) Patent No.: US 8,844,321 B2
(45) Date of Patent: Sep. 30, 2014

(54) APPARATUS AND METHOD FOR MANUFACTURING VITREOUS SILICA CRUCIBLE

(75) Inventors: Eriko Suzuki, Akita (JP); Hiroshi Kishi, Akita (JP)

(73) Assignee: Japan Super Quartz Corporation, Akita (JP)

( * ) Notice: Subject to any disclaimer, the term of this patent is extended or adjusted under 35 U.S.C. 154(b) by 300 days.

(21) Appl. No.: 12/893,326

(22) Filed: Sep. 29, 2010

(65) Prior Publication Data

US 2011/0079047 A1 Apr. 7, 2011

(30) Foreign Application Priority Data

Oct. 2, 2009 (JP) ................................ 2009-230832
Sep. 13, 2010 (JP) ................................ 2010-204464

(51) Int. Cl.
C03B 19/06 (2006.01)
C03B 19/09 (2006.01)
C03B 20/00 (2006.01)

(52) U.S. Cl.
USPC ............ 65/114; 65/17.3; 65/29.12; 65/29.13

(58) Field of Classification Search
USPC ........................................ 65/17.3–17.4, 144
See application file for complete search history.

(56) References Cited

U.S. PATENT DOCUMENTS

| | | | |
|---|---|---|---|
| 4,718,930 A * | 1/1988 | Gartner et al. ................ | 65/384 |
| 5,015,279 A * | 5/1991 | Guibert et al. ................ | 65/302 |
| 5,082,484 A * | 1/1992 | Koseki et al. ................ | 65/144 |
| 5,572,322 A * | 11/1996 | Noda ............................ | 356/338 |
| 5,913,975 A * | 6/1999 | Holder ......................... | 117/206 |
| 6,546,754 B1 * | 4/2003 | Hansen et al. ................ | 65/144 |
| 2002/0112658 A1 * | 8/2002 | Holder et al. ................ | 117/15 |
| 2002/0170316 A1 * | 11/2002 | Leist et al. ................... | 65/17.3 |
| 2003/0029195 A1 * | 2/2003 | Watanabe .................... | 65/17.4 |
| 2003/0205057 A1 * | 11/2003 | Peters et al. ................. | 65/17.4 |
| 2005/0235907 A1 * | 10/2005 | Ohama et al. ............... | 117/200 |
| 2006/0021567 A1 * | 2/2006 | Okita ........................... | 117/217 |
| 2009/0120352 A1 * | 5/2009 | Kubota et al. ................ | 117/13 |
| 2009/0165700 A1 * | 7/2009 | Kishi et al. .................. | 117/13 |

(Continued)

FOREIGN PATENT DOCUMENTS

| EP | 2172432 A1 | 4/2010 | |
|---|---|---|---|
| EP | 2325146 A2 | 5/2011 | |
| JP | 57211729 A * | 12/1982 | ............. H01L 21/22 |
| JP | 05-105577 A | 4/1993 | |

(Continued)

OTHER PUBLICATIONS

Extended European Search Report mailed Dec. 28, 2011, issued in corresponding Application No. EP 10185299.4.

Primary Examiner — Jodi C Franklin
(74) Attorney, Agent, or Firm — Pearne & Gordon LLP

(57) ABSTRACT

Provided are an apparatus and a method for manufacturing a vitreous silica crucible, which enable accurate measurement of a fume generation amount, prevention of deterioration of an inner surface property, and real-time control of a raw material melting state. Provided is an apparatus for manufacturing a vitreous silica crucible 50 by supplying silica powder into a mold 10 to form a silica powder layer 11, and heating and melting the silica powder layer 11 by arc discharge. The apparatus includes the mold 10 for defining an outer shape of a vitreous silica crucible, an arc discharge unit having a plurality of carbon electrodes 13 and a power-supply unit 40, and a fume-amount measurement unit 30 for detecting an amount of fumes 80 generated in the mold 10.

6 Claims, 6 Drawing Sheets

(56) References Cited

U.S. PATENT DOCUMENTS

| | | |
|---|---|---|
| 2010/0229599 A1 | 9/2010 | Fujita et al. |
| 2010/0319609 A1* | 12/2010 | Sato ................................ 117/13 |
| 2010/0328660 A1* | 12/2010 | Hager ........................... 356/326 |
| 2011/0123738 A1 | 5/2011 | Kemmochi et al. |

FOREIGN PATENT DOCUMENTS

| | | | |
|---|---|---|---|
| JP | 08-169798 A | 7/1996 | |
| JP | 2002-154894 A | 5/2002 | |
| WO | 02/055443 A2 | 7/2002 | |
| WO | WO 02055443 A2 * | 7/2002 | .............. C03B 19/09 |

* cited by examiner

APPARATUS AND METHOD FOR MANUFACTURING VITREOUS SILICA CRUCIBLE

CROSS-REFERENCE TO RELATED APPLICATION

This application is related to Japanese Patent Applications No. 2009-230832 filed on Oct. 2, 2009 and No. 2010-204464 filed on Sep. 13, 2010, whose priorities are claimed, and the disclosures of which are incorporated by reference in their entirety.

BACKGROUND OF THE INVENTION

1. Field of the Invention

The present invention relates to an apparatus and a method for manufacturing a vitreous silica crucible, and more specifically relates to a technique appropriate for inner surface property control in manufacturing a vitreous silica crucible for pulling a silicon single crystal.

2. Description of Related Art

In general, a silicon single crystal has been manufactured by the Czochralski method (the CZ method) using a vitreous silica crucible. In this method, polycrystalline silicon raw material is charged into a vitreous silica crucible, the raw material is melted to form silicon melt, a seed crystal is dipped into the silicon melt and the seed crystal is gradually pulled up, while rotating the seed crystal. The seed crystal acts as a crystal core to grow a silicon single crystal.

The vitreous silica crucible has a two-layer structure including an outer layer containing a number of bubbles and a transparent inner layer. A surface property of the inner layer contacting silicon melt in pulling a silicon single crystal largely affects a property of the resultant silicon single crystal and a yield of silicon wafers. Thus, conventionally, the inner layer is made of synthetic vitreous silica formed by amorphous synthetic silica powder, and the outer layer is made of natural vitreous silica.

Conventionally, in melting silicon and pulling a single crystal, there has frequently occurred a problem of melt surface vibration. According to this problem, dipping a seed crystal is disturbed by a wave generated on a liquid surface of silicon melt, and thus pulling of a silicon single crystal is prevented or single crystallization is deteriorated. This melt surface vibration (liquid surface vibration) phenomenon has become more likely to occur in accordance with increase in diameter of a silicon crystal, the demand to improve an inner surface property of a vitreous silica crucible has become stronger.

When a vitreous silica crucible is manufactured by the rotating mold method, silica powder is deposited inside the rotating mold to form a silica powder layer with a predetermined thickness, and thereafter the silica powder layer is melted by arc discharge, and cooled to be solidified. In the manufacturing process of a vitreous silica crucible, silica fumes are generated when a silica powder raw material is heated by arc discharge. So, in general, a manufacturing apparatus for a vitreous silica crucible includes an outlet tube to release gases and residues such as fumes from a furnace inside. However, the fumes tend to attach to electrodes or furnace walls within the furnace of the manufacturing apparatus, and the fumes can be peeled off and drop into the mold. When the fumes attached to a silica powder layer in the mold are melted and solidified, portions of the inner surface of the resulting vitreous silica crucible will have a deteriorated property.

Similar to the above-mentioned problem, when a silicon single crystal is pulled by the CZ method using a vitreous silica crucible with defects in the inner surface property, there has occurred a problem that dipping a seed crystal is disturbed by a wave generated on a liquid surface of silicon melt. Because of the problem, pulling of a silicon single crystal is prevented or single crystallization is deteriorated.

Nowadays, increase in diameter of a silicon single crystal has been demanded to produce wafers with a large diameter of 30 inches (76.2 cm) to 40 inches (116 cm). The increase in diameter requires a larger amount of powder in melting a silica powder layer, and requires a larger amount of powder to be applied to electrodes.

However, when a larger amount of powder is applied to electrodes, vibration generated in the electrodes increases. Thus, impurities attached to the electrodes become more likely to drop to the mold by the vibration. When the impurities are melted and solidified, the inner surface property of a vitreous silica crucible largely deteriorates. When a silicon single crystal is pulled using a vitreous silica crucible with defects in property, there occurs a problem in growth of a silicon single crystal.

JP-A-2002-154894 discloses a technique to remove silica fumes generated on an inner surface of a vitreous silica crucible to prevent the above-mentioned problems.

Furthermore, JP-B-2811290 and JP-B-2933404 disclose a technique to use amorphous synthetic silica powder to form an inner surface of a vitreous silica crucible to improve an inner surface property of a vitreous silica crucible.

SUMMARY OF THE INVENTION

However, in any of the above-mentioned documents, the amount of fumes generated in the manufacturing process of a vitreous silica crucible was not precisely detected, and fumes were removed in a post-process. Thus, proper control of the manufacturing condition was difficult. Therefore, the methods in the above-mentioned documents cannot improve an inner surface property, and thus cannot improve productivity and a yield.

In addition, when a vitreous silica crucible is manufactured by the rotating mold method, a high-temperature arc flame of several thousand ° C. is used to heat raw material powder up to a temperature of approx. 2000° C. or more to melt the raw material powder, but the temperature of a melted portion could not be precisely measured. Especially, contact temperature measurement of a melted portion is not preferred because contamination can occur and measurement element (terminal) can be damaged by high temperature of arc plasma existing nearby. In non-contact temperature measurement by such as a radiation thermometer, exact temperature measurement is difficult because an arc flame (arc plasma) whose temperature is higher than that of a melted portion exists on or near measurement portion and affects the measurement. Therefore, it is difficult to control a melting state based on the temperature of the melted portion.

Furthermore, in the rotating mold method, because a measurement position is rotating, it is difficult to exactly measure the temperature of the rotating measurement position without being affected by high-temperature arc.

The present invention has been made in view of the above-mentioned problems, and provides an apparatus and a method for manufacturing a vitreous silica crucible which can accomplish the following goals.

1. The amount of fume generation is exactly measured during manufacturing in a manufacturing process of a vitreous silica crucible.

2. Deterioration of an inner surface property of a vitreous silica crucible is prevented, and the inner surface property is improved.
3. Real-time control of raw material melting state is enabled in a manufacturing process of a vitreous silica crucible.
4. Ununiformity of product quality is reduced, and thus stable quality control is enabled.

An apparatus for manufacturing a vitreous silica crucible of the present invention includes: a mold for defining an outer shape of the vitreous silica crucible and in which silica powder is supplied to form a silica powder layer; an arc discharge unit comprising a plurality of electrodes and a power-supply unit with which the silica powder layer is heated and melted by arc discharge caused by the plurality of carbon electrodes; and a fume-amount measurement unit for detecting an amount of fumes generated in the mold. According to the configuration, the amount of fumes generated from a region near the surface of the silica powder layer can be measured in real time. Thus, it is possible to precisely measure the amount of fume generation while subjecting the silica powder layer to arc discharge, and thus to prevent the fumes from attaching to the silica powder layer, and to easily and precisely measure the manufacturing condition. Therefore, it is possible to feedback the measurement result of the fume-amount measurement unit to the manufacturing condition, and thus precise condition control to improve the inner surface property of a vitreous silica crucible is made possible.

Here, the inner surface property of a vitreous silica crucible mentioned in present invention means any factors affecting properties of a semiconductor single crystal pulled from a vitreous silica crucible. It especially means a property on a crucible inner surface side which contacts silicon melt at the beginning of pulling or is exposed to silicon melt after a certain amount of melting loss during pulling, and means a crucible property affecting strength of a crucible subjected to high temperature for a long time. Specifically, inner surface properties of a vitreous silica crucible means, for example, a bubble density, a bubble size, and an impurity concentration, a surface irregularity of a crucible inner surface shape, a vitrification state, an OH group content as a distribution state (uniformity, ununiformity) along a thickness direction or along an inner surface of a vitreous silica crucible. Furthermore, inner surface properties of a vitreous silica crucible can mean factors affecting properties of a semiconductor single crystal pulled from a vitreous silica crucible, such as a bubble distribution and a bubble size distribution in a crucible thickness direction, an impurity distribution in a region near a crucible inner surface, a surface irregularity, a vitrification state, an OH group content, and a distribution state such as ununiformity in a crucible height direction of these factors.

In the present invention, the fume-amount measurement unit may detect an amount of silica fumes, generated when the silica powder layer is subjected to arc discharge, by a photosensor, an imaging unit such as a CCD camera, an electrostatic sensor, or a dielectric sensor. When the fume amount is detected with such measurement units, precise measurement is enabled.

It is apparent that the present invention is not limited to the above-mentioned measurement units, but may employ other measurement units such as a unit to measure a mass concentration, and a configuration to use a piezoelectric element.

The present invention may further include a control unit controlling a melting state of vitreous silica in the mold by changing any of a relative position between the mold and the electrodes, a position of the mold, power supplied to the electrodes, or positions of the electrodes, based on a measurement result of the fume-amount measurement unit. In this case, a vitreous silica crucible can be manufactured while precisely controlling an inner surface property by controlling a vitreous silica melting state in the mold based on the measurement result from the fume-amount measurement unit.

In the present invention, the control unit may be configured to conduct any control of horizontally moving, tilting, rotating or pivoting the mold, or vertically relatively moving the electrodes and the mold, based on a measurement result of the fume-amount measurement unit. In this case, a vitreous silica crucible can be manufactured while more precisely controlling an inner surface property in controlling a vitreous silica melting state in the mold based on the measurement result from the fume-amount measurement unit.

In the present invention, the control unit may be configured to change any of a relative position between the mold and the electrodes, a position of the mold, power supplied to the electrodes, or positions of the electrodes, when the fume-amount measurement unit detects a change in an amount of fumes by more than 20% with respect to a reference fume amount. In this case, a vitreous silica crucible can be manufactured while more precisely controlling an inner surface property.

Here, a reference fume amount explained in the present invention means an empirical value (measurement value of a fume amount) corresponding to a fume amount detected when a preferred crucible is obtained. For example, in a manufacturing process where a melting state (heating state) is set in multiple steps such as generally four steps from the beginning of arc melting, a reference fume amount is set for each step. The reference fume amount may be set in advance in consideration of a measurement position or method of a fume amount.

Furthermore, "a change in an amount of fumes by more than 20% with respect to a reference fume amount" is stipulated to set a reference range, and when the change in the detected fume amount exceeds this range, a manufacturing condition may be controlled so as to reduce the change. Specifically, when the amount of fumes increases to exceed the reference range, temperature may be lowered, that is, control such as increasing a distance between the electrodes and the mold or decreasing a supplied power may be conducted. On the other hand, when the amount of fumes decreases to exceed the reference range, temperature may be increased, that is, control such as decreasing a distance between the electrodes and the mold or increasing a supplied power may be conducted.

The reference range may be 5% to 50%, preferably 10 to 30%, more preferably 15 to 25%, most preferably approx. 20% with respect to the reference fume amount.

In the present invention, the fume-amount measurement unit may be configured to be placed within a furnace in which the mold and the electrodes are accommodated for arc discharge and/or in an outlet tube to release fumes generated in the mold out of the furnace. In this case, the amount of fumes (measurement object) can be precisely measured.

A method for manufacturing a vitreous silica crucible of the present invention includes the steps of: a silica powder supplying step for supplying a silica powder into a mold to form a silica powder layer; and an arc melting step for melting the silica powder layer by arc discharge generated by a plurality of electrodes; wherein the arc melting step includes detecting an amount of fumes generated in the mold when melting the silica powder layer. According to the method, the amount of fumes generated from a region near the surface of the silica powder layer can be measured in real time. Thus, it is possible to precisely measure the amount of fume generation while subjecting the silica powder layer to arc discharge, and thus to prevent the fumes from attaching to the silica powder layer, and easily and precisely measure the manufacturing condition. Therefore, it is possible to feedback the measurement result of the fume amount to the manufacturing condition, and thus precise condition control to improve the inner surface property of a vitreous silica crucible is made possible.

In the present invention, the arc melting step may include detecting an amount of silica fumes, generated in the mold when the silica powder layer is subjected to arc discharge, by a photosensor, an imaging unit such as a CCD camera, an electrostatic sensor, or a dielectric sensor. According to this configuration, precise measurement is enabled.

In the present invention, the arc melting step may include controlling a melting state of vitreous silica in the mold by changing any of a relative position between the mold and the electrodes, a position of the mold, power supplied to the electrodes, or positions of the electrodes, based on a measurement result of the amount of fumes. In this case, a vitreous silica crucible can be manufactured while precisely controlling an inner surface property by controlling a vitreous silica melting state in the mold based on the measurement result of the fume amount.

In the present invention, the arc melting step may include conducting any control of horizontally moving, tilting, rotating or pivoting the mold, or vertically relatively moving the electrodes and the mold, based on a measurement result of the amount of fumes. In this case, a vitreous silica crucible can be manufactured while more precisely controlling an inner surface property in controlling a vitreous silica melting state in the mold based on the measurement result of the fume amount.

In the present invention, the arc melting step may include changing any of a relative position between the mold and the electrodes, a position of the mold, power supplied to the electrodes, or positions of the electrodes, when detecting a change in an amount of fumes by more than 20% with respect to a reference fume amount. In this case, a vitreous silica crucible can be manufactured while more precisely controlling an inner surface property. Because a change of 20% or less does not affect a crucible inner surface property, it is not preferable to change the amount of supplied power, a relative position between the mold and the electrodes, a mold rotational position, or positions of the electrodes because of fear of excessive response to the change of the fume amount.

In the present invention, the arc melting step may include detecting an amount of fumes within a furnace in which the mold and the electrodes are accommodated for arc discharge and/or in an outlet tube to release fumes generated in the mold out of the furnace. In this case, the amount of fumes (measurement object) can be precisely measured.

As raw material powder (silica powder), synthetic silica powder is primarily used for the inner face layer and natural silica powder is primarily used for the outer layer. Here, synthetic silica powder means powder made of synthetic silica, and a chemically synthesized and manufactured material. Synthetic silica powder is amorphous. Because raw material of synthetic silica is gas or liquid, it can be easily purified, and thus synthetic silica powder can be more highly-pure than natural silica powder. Raw material of synthetic silica may be gaseous raw material such as silicon tetrachloride, or may be liquid raw material such as silicon alkoxide. In synthetic vitreous silica, the amount of total impurities can be made 0.1 ppm or less.

Synthetic silica powder made by the sol-gel method usually includes 50 to 100 ppm of residual silanol. Synthetic silica powder made by silicon tetrachloride as raw material can control the amount of silanol in a broad range of 0 to 1000 ppm, and usually includes chlorine in a concentration of approx. 100 ppm or more. When alkoxide is used as raw material, synthetic vitreous silica not including chlorine can be easily obtained. Synthetic silica powder made by the sol-gel method includes silanol in a concentration of 50 to 100 ppm before melting as mentioned above. When the powder is vacuum-melted, silanol is removed and the amount of silanol in the obtained vitreous silica is reduced to approx. 5 to 30 ppm. It should be noted that the amount of silanol changes depending on melting conditions such as melting temperature, elevated temperature etc. Natural vitreous silica obtained by melting natural silica powder in the same conditions includes silanol in a concentration of less than 50 ppm.

In general, synthetic vitreous silica (vitreous silica obtained by melting synthetic silica powder) is said to have lower high-temperature viscosity than natural vitreous silica (vitreous silica obtained by melting natural silica powder). One of the reasons for the lower high-temperature viscosity is that silanol or halogen destroys a network structure of $SiO_4$ tetrahedron. Synthetic vitreous silica has high light transmissibility for ultraviolet with a wavelength of approx. 200 nm or less. This synthetic vitreous silica has similar property to synthetic vitreous silica made of silicon tetrachloride as raw material and used for ultraviolet optics. Unlike natural vitreous silica, when synthetic vitreous silica is excited by ultraviolet light with a wavelength of 245 nm, fluorescence peaks are not observed in the obtained fluorescence spectrum.

Furthermore, natural silica powder means powder made of natural silica. Natural silica means a material obtained by the steps of digging out naturally-existing quartz raw stones followed by crushing and purification etc. Natural silica powder is made of a-quartz crystal. Natural silica powder contains Al and Ti in a concentration of 1 ppm or more. Natural silica powder contains other metal impurities in a higher concentration than synthetic silica powder. Natural silica powder barely contains silanol.

When light transmissibility of natural vitreous silica is measured, light transmissibility rapidly decrease as the wavelength becomes shorter than 250 nm and light transmissibility is very small for light with a wavelength of 200 nm. This is mainly because of Ti contained in a concentration of about 1 ppm as impurities. An absorption peak is observed at around 245 nm. This peak is assigned to oxygen defects.

When natural vitreous silica is excited by ultraviolet light with a wavelength of 245 nm, fluorescence peaks at wavelengths of 280 nm and 390 nm are observed. These peaks are assigned to oxygen defects in the vitreous silica.

Whether vitreous silica is natural or synthetic may be determined by measuring either impurities concentrations, the amount of silanol, light transmissibility, or a fluorescence spectrum obtained by exciting the vitreous silica with ultraviolet light with a wavelength of 245 nm.

In the present invention, silica powder is used as raw material. Silica powder may be either synthetic silica powder or natural silica powder. Natural silica powder may be quartz powder, or powder of a well-known raw material for a vitreous silica crucible such as quartz crystal, quartz sand etc. Furthermore, silica powder may be crystalline, amorphous, or vitreous.

According to the above-mentioned configurations of the present invention where the amount of fume generation is measured during manufacturing a vitreous silica crucible, it is possible to prevent fumes to attach to a silica powder layer in the manufacturing process, and real-time control of raw material melting state is enabled. Therefore, ununiformity of product property is reduced, and thus stable quality control is enabled. Thus, a vitreous silica crucible excellent in an inner surface property can be manufactured.

Then, when a silicon single crystal is pulled from a vitreous silica crucible obtained according to the present invention, crystal defects are reduced and a silicon single crystal excellent in crystallization is obtained.

DESCRIPTION OF THE PREFERRED EMBODIMENTS

Hereinafter, there will be explained, in detail, an embodiment of an apparatus and a method for manufacturing a vitreous silica crucible according to the present invention, with reference to drawings.

Figure 1:
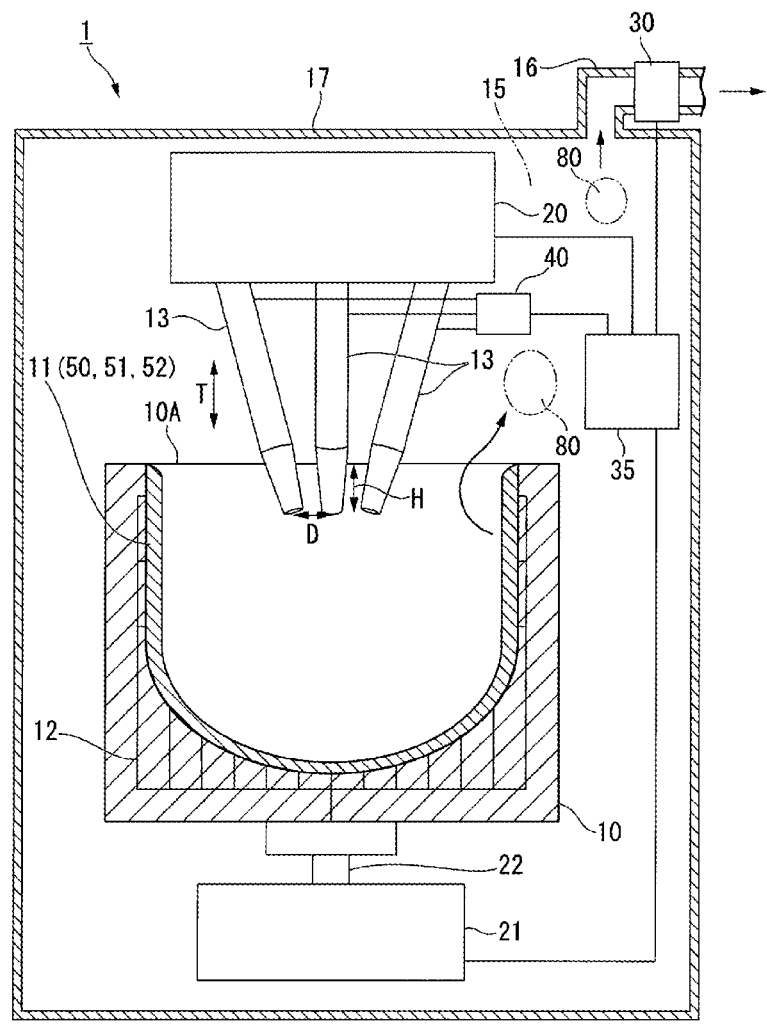
FIG. 1 is a front view illustrating an embodiment of an apparatus for manufacturing a vitreous silica crucible of the present invention.

FIG. 1 is a front sectional view illustrating a portion of an apparatus for manufacturing a vitreous silica crucible according to the present invention. In FIG. 1, reference symbol 1 refers to an apparatus for manufacturing a vitreous silica crucible. Drawings referenced in the following explanation are intended for explanation of an apparatus and a method for manufacturing a vitreous silica crucible according to the present invention, and sizes, thicknesses, and dimensions of various components in the drawings may be different from actual relationship in dimension.

A vitreous silica crucible obtained by the apparatus 1 or the manufacturing method of the present invention is used for pulling a silicon single crystal. In more detail, polycrystalline silicon raw material is charged into a vitreous silica crucible, the raw material is melted to form silicon melt, a seed crystal is dipped into the silicon melt and the seed crystal is gradually pulled up while rotating the seed crystal. The seed crystal acts as a crystal core to grow a silicon single crystal.

[Apparatus for Manufacturing Vitreous Silica Crucible]

As shown in FIG. 1, the apparatus 1 includes a mold 10 which is rotatable by a rotation unit (not shown) and defines an outer shape of a vitreous silica crucible. Raw material powder (silica powder) is supplied into and deposited on the inside of the mold 10 to form a silica powder layer 11 with a predetermined thickness. The mold 10 includes a plurality of ventilation holes 12 which are open to the inside of the mold 10. The ventilation holes 12 are connected to a pressure-reducing unit (not shown). Carbon electrodes 13, which are arc supplying units, are provided on an upper side of the mold, and are connected to a power-supply unit 40. Carbon electrodes 13 can be used to heat the silica powder layer 11.

The apparatus 1 includes a fume-amount measurement unit 30 detecting the amount of fumes 80 generated when the silica powder layer 11 is melted in the mold 10 by arc discharge generated between the carbon electrodes 13. In FIG. 1, the fume-amount measurement unit 30 is provided on an outlet tube 16 releasing the fumes 80 out of a furnace inside 15 surrounded by furnace walls 17. The apparatus 1 includes a control unit 35 controlling a melting state of vitreous silica in the mold 10 by changing any of a relative position between the mold 10 and the electrodes 13, a position of the mold 10, power supplied to the electrodes 13, or positions of the electrodes 13, based on a measurement result of the fume-amount measurement unit 30.

The carbon electrodes 13 shown in FIG. 1 are vertically movable in a direction of an arrow T by an electrode position setting unit 20 connected to the control unit 35, and thus the height direction position H of the carbon electrodes 13 is adjustable. Opening angles of the carbon electrodes 13 are variable by the electrode position setting unit 20. Interelectrode distances D etc. shown in an arrow D are adjustable. Other relative positions other than a height between the carbon electrodes 13 and the mold 10 are also adjustable by the electrode position setting unit 20. The electrode position setting unit 20 and the power-supply unit 40 are each connected to the control unit 35.

The apparatus 1 is a high-output apparatus which can heat and melt a nonconductive material (silica powder) by arc discharge between a plurality of carbon electrodes 13 with an output range of 300 kVA to 12,000 kVA. Power supplied to the carbon electrodes 13 from the power-supply unit 40 is controllable by the control unit 35.

Figure 2A:
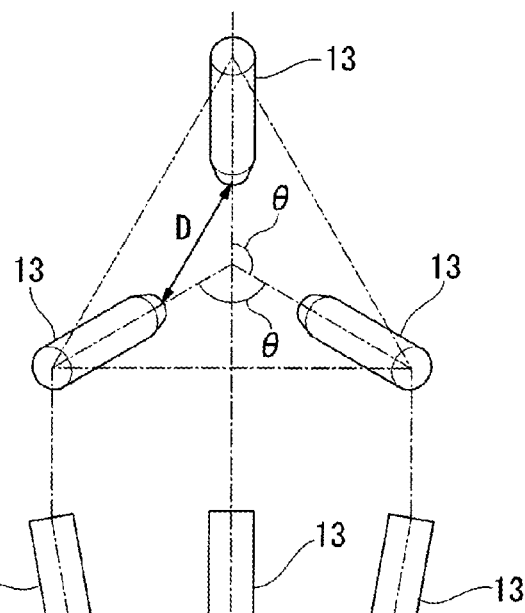
FIGS. 2A and 2B a plan view and a side view, respectively, each illustrating positions of electrodes in FIG. 1 of an embodiment of an apparatus for manufacturing a vitreous silica crucible of the present invention.
Figure 2B:
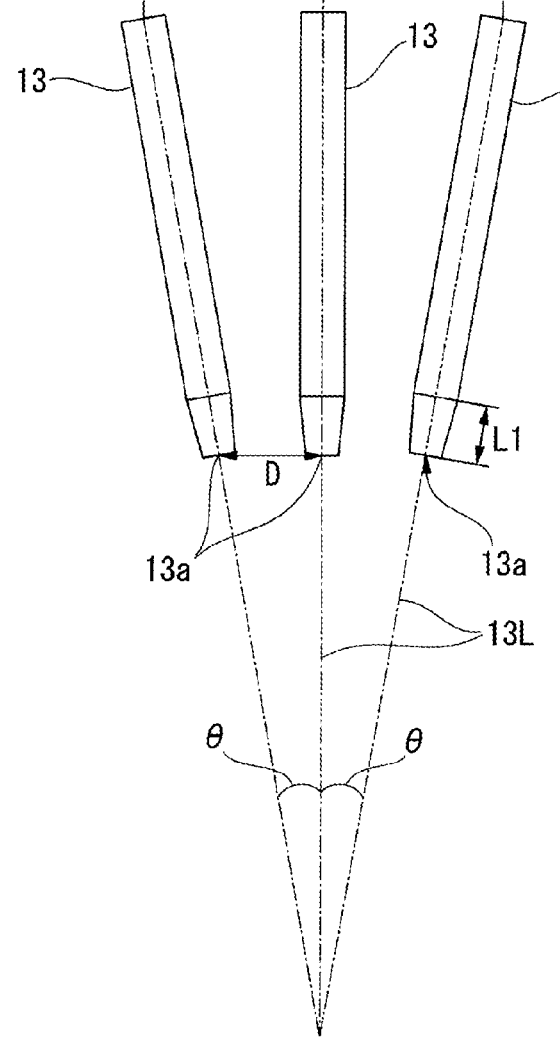

FIGS. 2A and 2B are a plan view and a side view, respectively, illustrating positions of the carbon electrodes 13 and the mold 10 of the apparatus 1.

Figure 3:
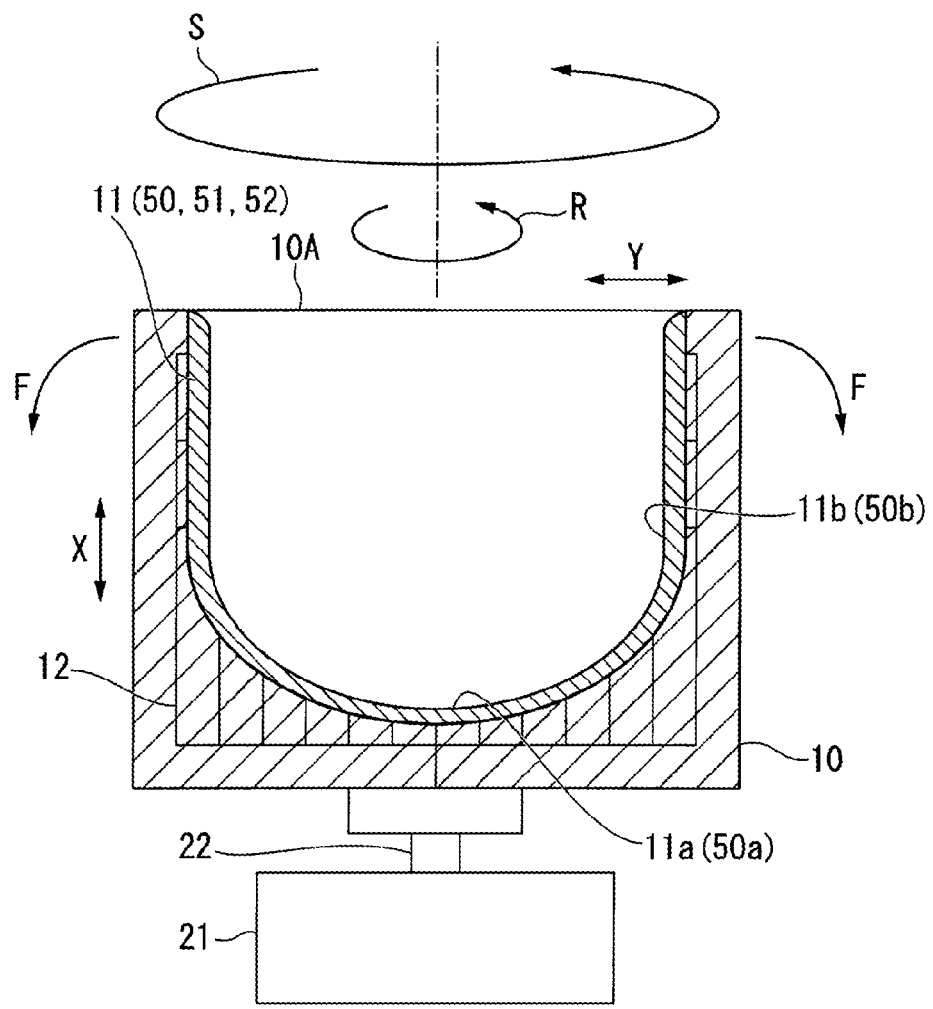
FIG. 3 is a side view illustrating a position of a mold in FIG. 1 of an embodiment of an apparatus for manufacturing a vitreous silica crucible of the present invention.

The carbon electrodes 13 are carbon-electrode rods with the same shape to generate arc discharge of, for example, alternate current three-phase (R phase, S phase, T phase). As shown in FIGS. 2 and 3, the carbon electrodes 13 are provided to form an inverse three-sided pyramid having a downwardly-directed tip. They are provided so that angles between axes 13L of the electrodes 13 are θ. The number of electrodes, a position, and a power supply method are not limited to the above embodiment, but other configurations may be employed.

The carbon electrodes 13 may be made of highly-pure carbon particles with a particle diameter of 0.3 mm or less, preferably 0.1 mm or less, more preferably 0.05 mm or less. When the density is 1.30 g/cm$^3$ to 1.80 g/cm$^3$ or 1.30 g/cm$^3$ to 1.70 g/cm$^3$, the difference in density between the carbon electrodes 13 may be made 0.2 g/cm$^3$ or less, and thus the carbon electrodes 13 can be made highly uniform.

The electrode position setting unit 20 includes a supporting unit, a horizontal movement unit, and a vertical movement unit. The supporting unit(s) supports the carbon electrodes 13 so that the interelectrode distances D are adjustable. The horizontal movement unit enables horizontal movement of the supporting unit. The vertical movement unit enables vertical movement of the supporting units and the horizontal movement units together. In the supporting unit, the carbon electrodes 13 are rotatably supported around an angle setting axis, and provided is a rotation unit to control a rotation angle around the angle setting axis. As shown with an arrow in FIG. 1, the interelectrode distances D of the carbon electrodes 13 may be adjusted by controlling the angles of the carbon electrodes 13 by the rotation unit and controlling a horizontal position of the supporting unit by the horizontal movement unit. Height positions H of electrode tips 13a with respect to an upper end position of the silica powder layer 11 (an upper end position of a mold opening) may be controlled by controlling the height position of the supporting unit by the vertical movement unit.

In the apparatus 1, measurement signals of the fume-amount measurement unit 30 are inputted into the control unit 35. Positions of the carbon electrodes 13 and applied power are controlled by the electrode position setting unit 20 and the power-supply unit 40 under the control of the control unit 35 based on the detected amount of fumes 80.

FIG. 3 is a side view illustrating a position of the mold 10 of the apparatus 1.

In the apparatus 1, as shown in FIG. 3, the mold 1 is configured to be horizontally moved (arrow Y direction), tilted (arrow F direction), rotated (arrow R direction), or pivoted (arrow S direction) by a mold position setting unit 21 connected to the control unit 35 via an operation axis 22. Furthermore, the apparatus 1 is configured to be capable of a move a relative vertical position of the carbon electrodes 13 (See FIG. 1) and the mold 10, as shown with an arrow X in FIG. 3.

The mold position setting unit 21 moves the mold 10 in various directions mentioned above under the control based on a measurement result of the fume-amount measurement unit 30.

As shown in FIG. 1, the mold position setting unit 21 changes a position and/or an angle of a rotation axis of the mold 10 while maintaining the rotation state or controlling the number of rotations of the mold via the operation axis 22. The mold position setting unit 21, though the details are not shown, includes a motor, a cam mechanism, and a lifting and lowering device etc. to move the operation axis 22 and the mold 10 in a desired direction.

The fume-amount measurement unit 30, as mentioned above, is provided on a pathway of the outlet tube 16, and measures the amount of fumes 80 which is contained in an exhaust gas to be released through the outlet tube 16, and is comprised of silica fumes.

The fume-amount measurement unit 30 outputs detection signals by detecting silica fumes, that is, fumes 80, which is a measurement object, by use of, for example, a photosensor, an imaging unit such as a CCD camera, an electrostatic sensor, or a dielectric sensor.

Figure 5:
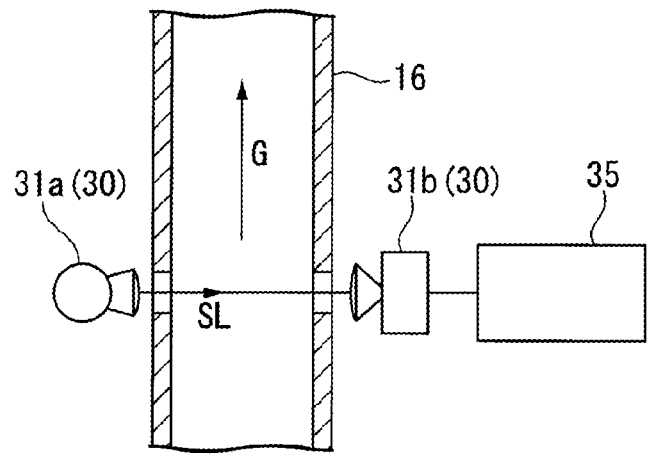
FIG. 5 is an enlarged front sectional view illustrating a fume-amount measurement unit of an embodiment of an apparatus for manufacturing a vitreous silica crucible of the present invention.

FIG. 5 shows an example of the fume-amount measurement unit 30 by the light transmission method utilizing the Lambert-Beer law.

In this case, the fume-amount measurement unit 30 includes a light-emitting unit (measuring light source) 31a, and a light-receiving unit 31b. The light-emitting unit 31a can emit measuring light SL crossing substantially orthogonally a flow rate direction of a gas flow G in the outlet tube 16. The light-receiving unit 31b can measure the intensity of the measuring light SL by directly receiving the light SL. The light-emitting unit 31a and the light-receiving unit 31b are directly attached to a region near an opening of the exhaust gas duct 16 so as to face each other. The attachment mechanism is not shown. A photosensor, an imaging unit etc. may be used as the light receiving element 31b.

In measurement by the fume-amount measurement unit 30, measuring light SL is emitted to an exhaust gas G in the outlet tube 16 from the light source 31a, a portion of the measuring light SL is shielded by dust particles (fumes) in the exhaust gas G flowing in the outlet tube 16, and a reduced amount of light (compared with the amount when no fume exists) is received by a light receiving element of the light-receiving unit 30. A relative concentration of dust particles (fumes) can be calculated by measuring the received light energy.

In place of configurations in FIG. 5, a detecting unit including a measuring light source 31a and a light receiving element 31b, and a reflector may be provided in the exhaust gas duct 16 so as to face each other. This is a double beam method where measuring light SL makes a round trip in the same optical path. In this method, the amount of received light is not proportional to a dust concentration. A dust condition can be monitored easily by relatively low-cost and a simple configuration.

Measurement may be made by guiding a portion of an exhaust gas from the outlet tube 16 to a measurement optical path provided outside of the outlet tube 16.

Figure 6:
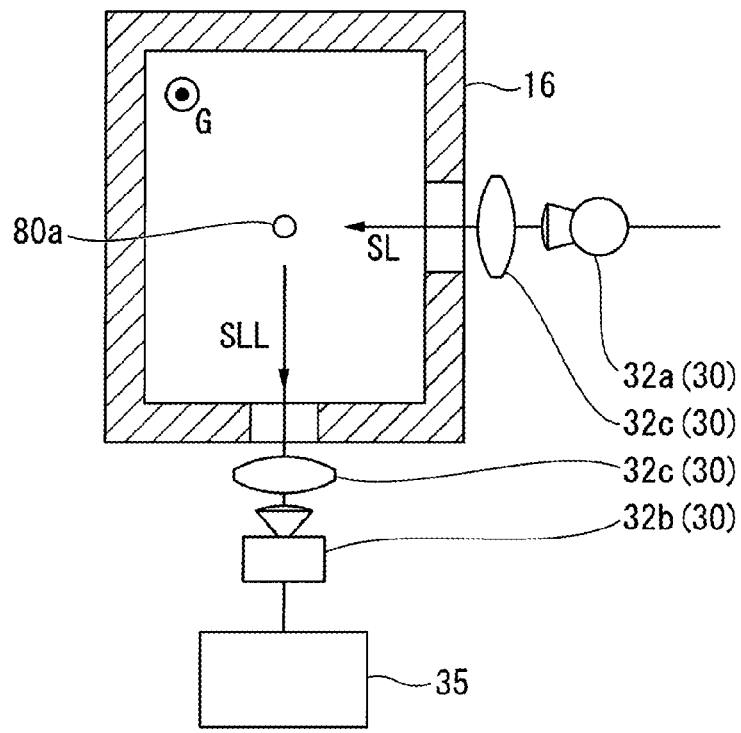
FIG. 6 is an enlarged side sectional view illustrating another example of a fume-amount measurement unit of an embodiment of an apparatus for manufacturing a vitreous silica crucible of the present invention.

FIG. 6 shows an example of the fume-amount measurement unit 30 by the light scattering method.

In this case, the fume-amount measurement unit 30 includes a light-emitting unit (measuring light source) 32a and a light-receiving unit 32b. The light-emitting unit 32a can emit measuring light SL crossing substantially orthogonally a flow rate direction of a gas flow G in the outlet tube 16. The light-receiving unit 32b can measure the intensity of a scattered light SLL which is not in a direction of either the flow rate direction of the gas flow G or the direction of the measuring light SL. The light-emitting unit 32a and the light-receiving unit 32b are directly attached to a region near an opening of the exhaust gas duct 16 as well as a lens 32c.

In measurement by the fume-amount measurement unit 30, measuring light SL is emitted to dust particles in an exhaust gas in the outlet tube 16, the measuring light SL is absorbed and scattered by the particles 80. The intensity of the scattered light SLL is obtained utilizing that the intensity is proportional to the dust concentration. Specifically, the intensity of the scattered light SLL is obtained by electrically converting and computing the scattered light SLL obtained by continuously irradiating, with the measuring light SL, dust particles (fumes) 80 passing through a detection location which is a region near a center of the outlet tube 16. In this example, calibration of a dust concentration may be made by a span point calibration using a standard scattering bar or a zero point calibration in a clean air, and weight conversion factor can be set based on measurement value obtained in accordance with JIS Z 8808. The measurement is similar to the isokinetic sampling where sample is obtained from a gas sampling outlet from the furnace inside 15 in the same flow rate as that in the outlet tube 16, and thus error due to the flow rate is minimal, and measurement value similar to that in the above JIS method can be obtained. A photosensor, an imaging unit etc. may be used as the light receiving element 32b.

Figure 7:
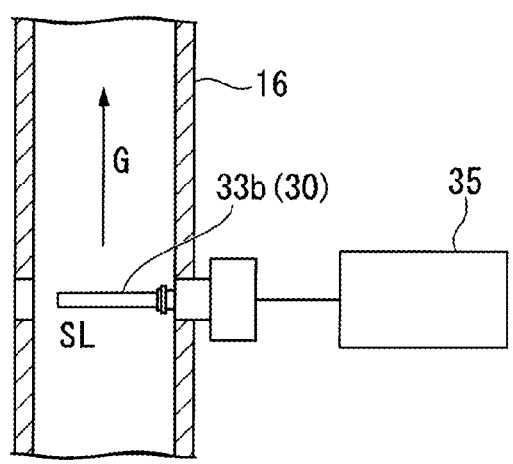
FIG. 7 is an enlarged front sectional view illustrating another example of a fume-amount measurement unit of an embodiment of an apparatus for manufacturing a vitreous silica crucible of the present invention.

FIG. 7 shows an example of the fume-amount measurement unit 30 by the friction static electricity detection method. In this case, as the fume-amount measurement unit 30, a rod-shaped electrostatic sensor 33b crossing substantially orthogonally a flow rate direction of a gas flow G in the outlet tube 16 is directly attached to the exhaust gas duct 16.

Measurement in the fume-amount measurement unit 30 is known as friction static electricity or contact charging. Movements of charges between two particles which occurs when those particles contacts each other is utilized in the measurement. Specifically, the sensor probe 33b which is provided with the base end attached to the exhaust gas duct 16 is inserted into an exhaust gas G, and when fume particles 80 in the exhaust gas G collide with or pass through near the sensor probe 33b, movements of charges occurs. Relative concentration of dusts can be measured based on the amount of current generated in the sensor.

The current generated by friction static electricity is calculated by the following formula.

$$I = Ka \cdot M \cdot V \cdot (b/d)$$

Here,
I: friction current (A)
Ka: constant
M: mass flow rate of fume particles (kg/s)
V: flow rate (m/s)
b: constant
d: particle diameter (m)

Detection signals outputted from light-receiving units (sensors) 31b, 32b, 33b of the fume-amount measurement unit 30 are inputted into a controller (CPU) via an A/D converter (not shown) and a measurement value of the fumes 80 can be obtained precisely, and can be outputted to a control unit 35, which will be explained later.

As a dielectric sensor, although not shown, a permittivity detector including capacitance detecting terminals facing each other may be provided, similar to the light-emitting unit 31a and the light-receiving unit 31b. A permittivity in the permittivity detector is changed by dust particles (fumes) in a gas G flowing in the outlet tube 16, and this change can be measured in a dielectric sensor to determine a relative concentration of dust particles (fumes) in comparison with a permittivity when no fume exists.

The present invention is not limited to the present embodiment where the fume-amount measurement unit 30 is provided on the outlet tube 16 to release fumes 80 generated in the mold 10 out of the furnace. For example, the fume-amount measurement unit 30 may be provided in the furnace inside 15 in which the mold 10 and the carbon electrodes 13 are accommodated and arc discharge is generated. The fume-amount measurement unit 30 may be provided on any location as long as the fume amount can be precisely measured on the location. For example, the fume-amount measurement unit 30 by the light scattering method can be provided so that angles of the light-emitting unit 32a and the light-receiving unit 32b are adjusted to set the measurement position near a point 10 cm above the upper end of the rotating mold 10. Alternatively, the fume-amount measurement unit 30 can be provided on the outlet tube 16 while setting the measurement position on the opening of the outlet tube 16 toward the furnace inside 15.

Signals of the measurement amount of fumes 80 in the fume-amount measurement unit 30 are inputted into the control unit 35. The control unit 35 is, for example, comprised of an arithmetic processing unit such as a CPU. The control unit 35 conducts control by changing any of a relative position between the mold 10 and the electrodes 13, a position of the mold 10, power supplied to the electrodes 13, or positions of the electrodes 13, based on a measurement result outputted from the fume-amount measurement unit 30. The control unit 35 can appropriately control a melting state of vitreous silica in the mold by the above-mentioned control. The control unit 35 may includes a display such as an LCD display. In this case, the operator can monitor a state of the manufacturing condition in real time.

Preferably, the control unit is configured to be capable of conducting control by changing any of a relative position between the mold 19 and the carbon electrodes 13, a position of the mold 10, power supplied to the carbon electrodes 13, and a position of the carbon electrodes 13, when the fume-amount measurement unit detects a change in an amount of fumes 80 by more than 20% with respect to a reference fume amount.

The apparatus 1 includes the fume-amount measurement unit 30, and thus can measure the amount of fumes during manufacturing and feedback the measurement result to the manufacturing condition in real time. According to this configuration, the amount of fume 80 generation can be continuously monitored, and deterioration of an inner surface property in manufacturing a vitreous silica crucible 50 can be prevented. In other words, in the manufacturing process, attachment of fumes 80 to the silica powder layer 11 can be prevented while a raw material melting state can be controlled in real time. Therefore, ununiformity of a product property is reduced, and thus stable quality control is enabled. Thus, a vitreous silica crucible 50 excellent in an inner surface property can be manufactured.

[Method of Manufacturing Vitreous Silica Crucible]

Next, a method of manufacturing a vitreous silica crucible will be explained in detail with reference to drawings as necessary.

The method of the present embodiment is a method of depositing silica powder in the mold 10 to form a silica powder layer 11, and heating and melting the silica powder layer 11 by arc discharge. The method includes a silica powder supplying step for supplying silica powder in the mold 10 to from a silica powder layer 11, and an arc melting step for melting the silica powder layer 11 by arc discharge generated by a plurality of carbon electrode 13. The arc melting step is a method of melting the silica powder layer 11 while detecting the amount of fumes 80 generated in the mold 10.

Figure 4:
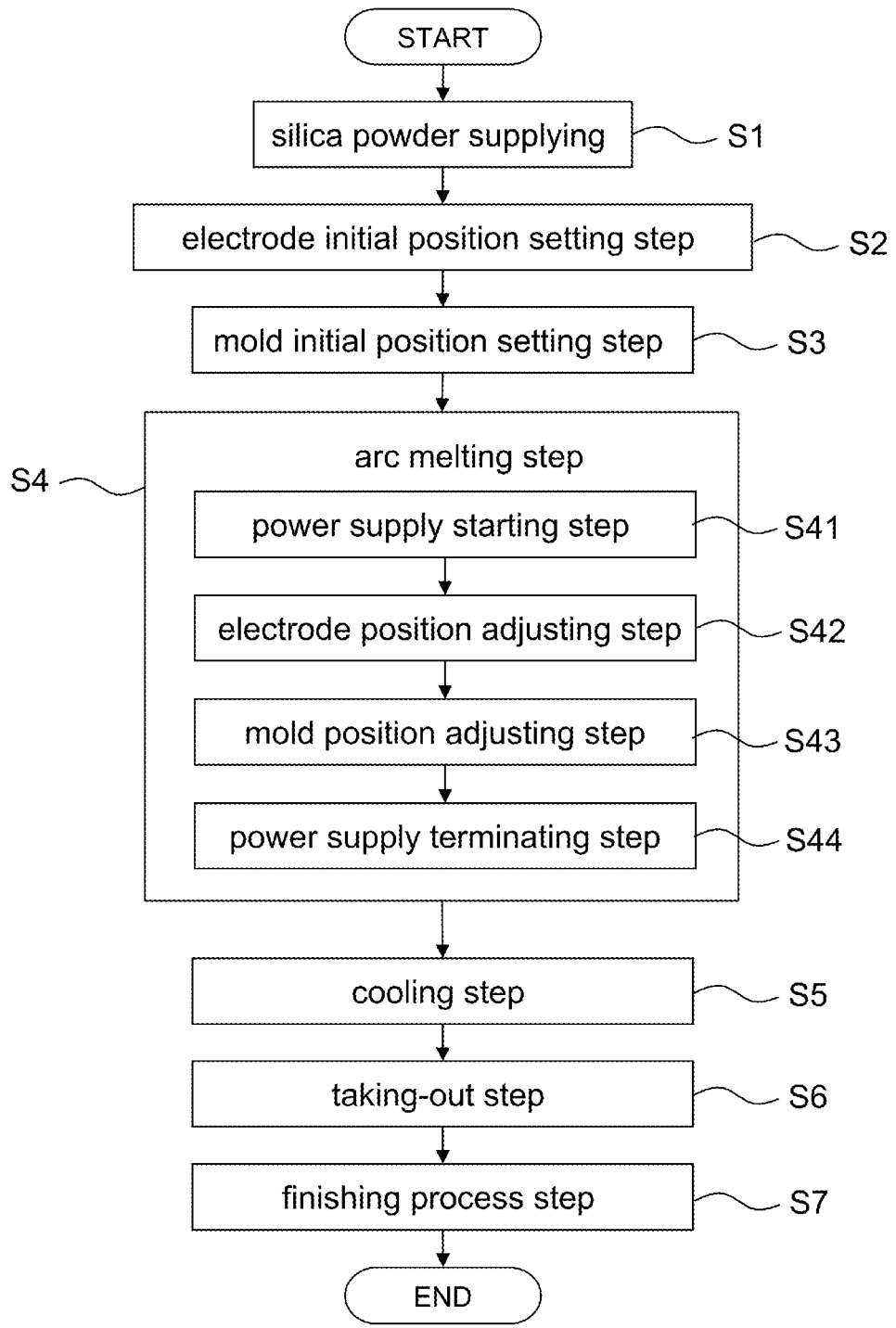
FIG. 4 is a flowchart illustrating steps in a manufacturing process conducted with an embodiment of an apparatus for manufacturing a vitreous silica crucible of the present invention.

FIG. 4 is a flowchart illustrating the method of the present embodiment. The method of the present embodiment is the rotating mold method using the apparatus shown in FIG. 1. As shown in FIG. 4, the method includes a silica powder supplying step S1, an electrode initial position setting step S2, a mold initial position setting step S3, an arc melting step S4, a cooling step S5, a taking-out step S6, a finishing process step S7.

In the silica powder supplying step S1 shown in FIG. 4, raw material silica powder is deposited on an inner surface of the mold 10 to form a silica powder layer 11 in a desired shape, that is, a crucible shape. This silica powder layer 11 is retained onto the inner wall surface by a centrifugal force due to rotation of the mold 10.

Next, in the electrode initial position setting step S2 shown in FIG. 4, as shown in FIGS. 1 and 2, initial positions of the carbon electrodes 13 are set by the electrode position setting unit 20 so that the carbon electrodes 13 form an inverse three-sided pyramid, each axis line 13L is directed to a direction so as to maintain an appropriate angle, and the tips of the carbon electrodes 13 contact one another. In addition, an initial state of a mold-electrode relative position comprised of an electrode height position H which is a height dimension from the edge of the mold 10 to the electrode tips, or a position and an angle of an electrode position central axis (which is a central axis of an inverse three-sided pyramid formed by the carbon electrodes 13) and a rotation axis line of the mold 10 are also set.

Next, in the mold initial position setting step S3, an initial state of the mold 10 is set by the mold position setting unit 21 so that the mold 10 is vertically placed with the opening 10A directed upwardly.

Next, in the arc melting step S4 shown in FIG. 4, the retained silica powder layer 11 is heated and melted by an arc discharge unit by adjusting positions of the electrodes 13 while a region between the mold 10 and the silica powder layer 11 subjected to a reduced pressure through ventilation holes 12, to form a vitreous silica layer.

The arc melting step S4 of the present embodiment include a power supply starting step S41, an electrode position adjusting step S42, a mold position adjusting step S43, and a power supply terminating step S44. Here, in the power supply starting step S41, powder is supplied to the carbon electrodes 13 in a predetermined amount from the power-supply unit 40. Arc discharge is not yet generated at this stage.

Next, in the electrode position adjusting step S42 shown in FIG. 4, the interelectrode distances D are enlarged by changing the angles of the carbon electrodes 13 while maintaining the inverse three-sided pyramid with a downward tip by the electrode position setting unit 20. Then, arc discharge starts to be generated between the carbon electrodes 13. Supplied power to each of the carbon electrodes 13 is controlled to be a power density of, for example, 40 kVA/cm$^2$ to 1700 kVA/cm$^2$ by the power-supply unit 40. Furthermore, the mold-electrode relative position, such as the electrode height position H, is set to satisfy conditions to be a heat source necessary for melting of the silica powder layer 11 while maintaining the angles of θ by the electrode position setting unit 20.

A power density explained in the present invention means the amount of supplied power per unit cross-sectional area of a cross section crossing orthogonally an electrode central axis. Specifically, the power density is measured in a position approx. 15 to 25 mm, preferably 20 mm from the electrode tip in a length of the axis direction. The power density is expressed in a formula {supplied power amount (kVA)/electrode cross-section area (cm$^2$)}. The supplied power amount is a power supplied to one electrode, and the electrode cross-section area is an electrode cross-section area of a cross section crossing orthogonally an electrode central axis. More specifically, an electrode diameter in the 20 mm position is preferably φ20 to 40 mm, more preferably φ25 to 35 mm, most preferably φ30 mm.

In the mold position adjusting step S43 shown in FIG. 4, operations of the mold position setting unit 21 and the electrode position setting unit 20 are controlled based on measurement signals of the detected amount (generation amount) of the fumes 80, outputted from the fume-amount measurement unit 30 provided on the outlet tube 16 and comprised of a photosensor, an imaging unit such as a CCD camera, an electrostatic sensor, or a dielectric sensor. In the present embodiment, a melting state of vitreous silica in the mold 10 is controlled by changing any of a relative position between the mold 10 and the electrodes 13, a position of the mold 10, power supplied to the electrodes 13, or positions of the electrodes 13 by the control unit 35, based on the amount of fumes measured in the fume-amount measurement unit 30.

In the mold position adjusting step S43 of the arc melting step S4, it is preferable to control the mold 1 to be horizontally moved (arrow Y direction), tilted (arrow F direction), rotated (arrow R direction), pivoted (arrow S direction) or to be vertical moved to adjust a relative vertical position of the carbon electrode 13 and the mold, as shown with the arrow X in FIG. 3, based on a measurement result of the amount of fumes 80. In this case, in controlling a vitreous silica melting state in the mold 10 based on a measurement result of the amount of fumes 80, an inner surface property can be more precisely controlled to manufacture a vitreous silica crucible 50.

Furthermore, in the mold position adjusting step S43, when a change in an amount of fumes by more than 20% with respect to a reference fume amount is detected, any of positions of the mold 10 and the carbon electrodes 13, and power supplied to each of the carbon electrodes 13 can be adjusted. In this case, an inner surface property can be more precisely controlled to manufacture a vitreous silica crucible 50.

In the mold position adjusting step S43 of the arc melting step S4 in the present embodiment, the amount of fumes 80 is measured on a pathway of the outlet tube 16 to release fumes 80 generated in the mold 10 out of the furnace. However, the present invention is not limited to this configuration. For example, the amount of fumes 80 may be measured in the furnace inside 15. In either of these configurations, the amount of fumes 80 which is a measurement object can be precisely measured.

Furthermore, in the mold position adjusting step S43 provided in the present embodiment, the control unit 35 may include a display. In this case, the operator can monitor a state of the manufacturing condition in real time. For example when the amount of fume 80 generation exceeds a predetermined value, the operator can take measures to prevent contamination deriving from fumes 80 in the furnace inside 15.

Next, in the power supply terminating step S44, power supply by the power-supply unit 40 is terminated when the silica powder layer 11 is melted to be a predetermined state.

In the arc melting step S4, the silica powder layer 11 made of silica powder is melted to form a vitreous silica layer 51.

Next, in the cooling step S5 shown in FIG. 4, after power supply to the electrodes 13 is terminated, the vitreous silica layer 51 is cooled.

Next, in the taking-out step S6 shown in FIG. 4, a semi-manufactured crucible 52 is taken out of the mold 10.

Thereafter, in the finishing process step S7, a honing process to jet high-pressure water to a crucible outer face, a rim cut process to adjust a crucible height dimension to a predetermined state, and a washing process to wash a crucible inner surface by an HF process etc. are conducted to manufacture a vitreous silica crucible 50.

In the present embodiment, in the arc melting step S4, the amount of fumes 80 generated from a region near the surface of the silica powder layer can be measured in real time. Thus, it is possible to feedback the measurement result of the amount of fume 80 generation to the manufacturing condition while subjecting the silica powder layer 11 to arc discharge. Therefore, precise condition control to improve a crucible inner surface property becomes possible. In addition, attachment of fumes 80 to the silica powder layer 11 can be prevented by precisely measuring the amount of fume 80 generation in real time.

As described, according to the apparatus and the method of manufacturing a vitreous silica crucible of the present invention, because the amount of fume 80 generation can be measured in manufacturing a vitreous silica crucible 50, attachment of fumes 80 to the silica powder layer 11 can be prevented in the manufacturing process while a raw material melting state can be controlled in real time. Therefore, ununiformity of product property is reduced, and thus stable quality control is enabled. Thus, a vitreous silica crucible 50 excellent in an inner surface property can be manufactured.

Then, when a silicon single crystal is pulled from a vitreous silica crucible 50 obtained according to the present invention, crystal defects are reduced and a silicon single crystal excellent in crystallization is obtained.

EXAMPLE

Hereinafter, the apparatus and the method of manufacturing a vitreous silica crucible will be explained in detail with reference to Examples. The present invention is not limited to the Examples.

In each of the following Examples and Comparative examples, a vitreous silica crucible was manufactured by the rotating mold method under the conditions described below. The mold had an opening diameter of 868.8 mm (34.2 inches), an average thickness of a silica powder layer deposited on the mold inner surface was 28 mm to manufacture a vitreous silica crucible with an opening diameter of 812.8 mm (32 inches). The electrodes were powered for 60 minutes to melt the silica powder layer, and likewise vacuum suction of the silica powder layer was conducted for the 60 minutes from the beginning in a pressure of at most approx. 80 to 90 to 100 to 120 kPa by a pressure-reducing unit.

Examples 1 to 6

In Examples 1 to 3, used was an apparatus for manufacturing a vitreous silica crucible including a fume-amount measurement unit on an outlet tube having an opening to a furnace inside in a position 10 cm above an upper end of the mold. The outlet tube was connected to the outside of the furnace. A silica powder layer deposited on the mold inner surface was melted to be vitrified while detecting the amount of fumes generated in the mold. A photosensor, a CCD camera which was an imaging unit, or a dielectric sensor was used as a fume-amount measurement unit. A fume-amount measurement unit which was capable of arithmetic processing image signals is used. Arc discharge was conducted under the conditions shown in Table 1 to manufacture vitreous silica crucibles of Examples 1 to 3. In Table 1, the location of the fume-amount measurement unit was described as "furnace inside."

In a similar manner to Examples 1 to 3, in Examples 4 to 6, used was an apparatus for manufacturing a vitreous silica crucible including a fume-amount measurement unit on an outlet tube having an opening to a furnace inside on a furnace wall (ceiling). The outlet tube was connected to the outside of the furnace.

In the present Examples, attachment of fumes to carbon electrodes and furnace walls was continuously visually observed when arc melting the silica powder layer. Furthermore, a reference fume amount was predetermined to be an amount of fumes measured when a preferable crucible was obtained, and when a change in the amount of fumes with respect to the reference fume amount was more than 20%, the manufacturing condition was adjusted. Specifically, because the amount of fumes detected in the fume-amount measurement unit when a preferable crucible was obtained was approx. 0.004 mg/m$^3$ in 10 seconds on average, the reference fume amount was set to this value, and the manufacturing condition was adjusted when a change in the amount of fumes with respect to the reference fume amount was more than 20%. Exhaust gas flow rate in the outlet tube was $3\pm0.1\times10^{-2}$ m$^3$/sec.

Here, when the amount of fumes increased by more than 20% with respect to the reference fume amount, the temperature of the melted silica powder layer was lowered by decreasing a supplied power to the carbon electrodes (decreasing arc strength), or increasing a distance between the carbon electrodes and the mold. On the other hand, when the amount of fumes decreased by more than 20% with respect to the reference fume amount, the temperature of the melted silica powder layer was increased by increasing a supplied power to the carbon electrodes, or decreasing a distance between the carbon electrodes and the mold.

A surface condition of an inner surface of a vitreous silica crucible, that is, a sidewall inner surface and a bottom inner surface were visually examined based on the following criteria. The result was shown in Table 2 together with the result about whether or not attachment of fumes to the carbon electrode or furnace walls inside occurred.
(1) Excellent: surface defects (excessive bubbles, surface irregularities, inappropriate vitrification generated due to inappropriate heating, and surface defects caused due to a drop of fumes) were hardly observed in the inner surface of the manufactured vitreous silica crucible.
(2) Good: the above surface defects were slightly observed in the inner surface of the manufactured vitreous silica crucible, but within an acceptable range.
(3) Poor: the above surface defects were numerously observed in the inner surface of the manufactured vitreous silica crucible.

Silicon single crystals were pulled using vitreous silica crucibles manufactured in the above mentioned conditions. Single crystal yields of the obtained silicon single crystals were measured and the crystals were evaluated based on the following criteria. The result was shown in Table 2.
(1) Excellent: the single crystal yield was over 70%, and the crystal property was excellent.
(2) Good: the single crystal yield was between 50 to 70%, which was an acceptable range.
(3) Poor: the single crystal yield was less than 50%, and many crystal defects were observed.

Comparative Example 1

In Comparative example 1, a vitreous silica crucible was manufactured in a similar manner to Examples 4 to 6 except that an apparatus with no fume-amount measurement unit was used and no control based on the amount of fumes was conducted when arc-melting a silica powder layer supplied in the mold.

In a similar manner to Examples 4 to 6, silicon single crystals were pulled using vitreous silica crucibles manufactured in the above mentioned conditions. Single crystal yields of the obtained silicon single crystals were measured and the crystals were evaluated based on the following criteria. The result was shown in Table 2.

The manufacturing conditions in Examples and Comparative examples are listed in Table 1, and evaluation results are listed in Table 2.

TABLE 1

| | carbon electrodes | | | fume-amount measurement unit | | | arc discharge condition | | |
| --- | --- | --- | --- | --- | --- | --- | --- | --- | --- |
| | | | | | | | power density | discharge power | powered time |
| | the number | tip shape | diameter | exist? | kind | location | (kVA/cm$^2$) | (kVA) | (min) |
| Example 1 | 3 | circular truncated cone | 50 | yes | photo sensor | furnace inside | 600 | 3000 | 60 |

TABLE 1-continued

|  | carbon electrodes | | | fume-amount measurement unit | | arc discharge condition | | |
|---|---|---|---|---|---|---|---|---|
|  |  |  |  |  |  | power density | discharge power | powered time |
|  | the number | tip shape | diameter | exist? | kind | location | $(kVA/cm^2)$ | (kVA) | (min) |
| Example 2 | 3 | circular truncated cone | 50 | yes | dielectric sensor | furnace inside | 600 | 3000 | 60 |
| Example 3 | 3 | circular truncated cone | 50 | yes | CCD camera | furnace inside | 600 | 3000 | 60 |
| Example 4 | 3 | circular truncated cone | 50 | yes | photo sensor | outlet tube | 600 | 3000 | 60 |
| Example 5 | 3 | circular truncated cone | 50 | yes | dielectric sensor | outlet tube | 600 | 3000 | 60 |
| Example 6 | 3 | circular truncated cone | 50 | yes | CCD camera | outlet tube | 600 | 3000 | 60 |
| Comp. Example 1 | 3 | circular truncated cone | 50 | no | — | — | 600 | 3000 | 60 |

TABLE 2

|  | fume attached? | | crucible inner surface state | | evaluation of property in pulling single crystal | |
|---|---|---|---|---|---|---|
|  | furnace wall | carbon electrodes | bottom inner surface | sidewall inner surface | single crystal yield (%) | judgement |
| Example 1 | no | no | excellent | excellent | 84 | excellent |
| Example 2 | no | no | excellent | good | 76 | excellent |
| Example 3 | no | no | excellent | excellent | 85 | excellent |
| Example 4 | no | no | excellent | excellent | 80 | excellent |
| Example 5 | no | no | excellent | good | 73 | excellent |
| Example 6 | no | no | excellent | excellent | 80 | excellent |
| Comp. Example 1 | yes | yes | poor | good | 35 | poor |

As shown in Table 2, in vitreous silica crucibles of Examples 1 to 6, which were manufactured in accordance with the apparatus and the method of the invention, surface defects in the inner surface were hardly observed, and thus evaluations of the surface property were all "excellent" or "good." Thus, in accordance with the apparatus and the method of the invention, the amount of fume generation was effectively reduced and the obtained vitreous silica crucibles were excellent in the inner surface property.

When silicon single crystals were pulled using the vitreous silica crucibles obtained in accordance with the apparatus and the method of the invention, the single crystal yields were 75 to 80% as shown in Table 2, and the evaluations of properties in pulling single crystals were all "excellent." Thus, single crystals without crystal defects and with excellent property were obtained.

On the other hand, in a vitreous silica crucible of Comparative example 1, which was manufactured using a conventional apparatus and a method of manufacturing a vitreous silica crucible, fumes were attached to the furnace wall and the carbon electrodes. As in Comparative example 1, when a vitreous silica crucible is manufactured using a conventional apparatus and a method, a melting state may not be appropriate adjusted and a large amount of fumes may be generated, and thus an inner surface property of the obtained crucible can be deteriorated.

When a silicon single crystal was pulled using the vitreous silica crucible obtained in Comparative example 1, the single crystal yield was as low as 35%, and the evaluation of a property in pulling a single crystal was "poor," and the crystal included defects.

As shown in the above results, according to the apparatus and the method of the invention where the amount of fume generation is detected while melting a silica powder layer, a manufacturing condition can be easily controlled, and surface defects, caused by fumes, in a crucible inner surface can be prevented, and thus a vitreous silica crucible excellent in an inner surface property can be obtained.

Then, when a silicon single crystal is pulled from a vitreous silica crucible obtained according to the present invention, crystal defects are reduced and a silicon single crystal excellent in crystallization is obtained.

What is claimed is:
1. An apparatus for manufacturing a vitreous silica crucible comprising:
a mold for defining an outer shape of the vitreous silica crucible and in which silica power is supplied to form a silica powder layer;
an arc discharge unit comprising a plurality of carbon electrodes and a power-supply unit with which the silica powder layer is heated and melted by arc discharge caused by the plurality of carbon electrodes; and a silica fume-amount measurement unit for detecting an amount of silica fumes generated in the mold.

2. The apparatus of claim 1, wherein the silica fume-amount measurement unit detects an amount of silica fumes, generated when the silica powder layer is subjected to arc discharge, by a photosensor, an imaging unit, an electrostatic sensor, or a dielectric sensor.

3. The apparatus of claim 1, further comprising an electrode position setting unit for changing a relative position between the mold and the electrodes, and positions of the electrodes, a mold position setting unit for changing a position of the mold, and a control unit for connecting and controlling the electrode position setting unit, the mold position setting unit and the power-supply unit, wherein the power-supply unit changes a power supplied to the electrodes, the control unit controls the electrode position setting unit, the mold position setting unit and the power-supply unit to control a melting state of vitreous silica in the mold by changing any of the relative position between the mold and the electrodes, the position of the mold, the power supplied to the electrodes, or the positions of the electrodes, and the control unit is configured to, when the amount of silica fumes exceeds a certain threshold, decrease the power supplied to the electrodes or increase the distance between the electrodes and the mold, and when the amount of silica fumes is below a certain threshold, increase the power supplied to the electrodes or decrease the distance between the electrodes and the mold.

4. The apparatus of claim 3, wherein the control unit conducts any control of horizontally moving, tilting, rotating or pivoting the mold, or vertically relatively moving the electrodes and the mold, based on the amount of silica fumes.

5. The apparatus of claim 3, wherein the control unit changes any of a relative position between the mold and the electrodes, a position of the mold, power supplied to the electrodes, or positions of the electrodes, when the silica fume-amount measurement unit detects a change in the amount of silica fumes by more than 20% with respect to a reference silica fume amount.

6. The apparatus of claim 1, wherein the silica fume-amount measurement unit is placed within a furnace in which the mold and the electrodes are accommodated for arc discharge and/or in an outlet tube to release silica fumes generated in the mold out of the furnace.

* * * * *